(12) United States Patent
Yang

(10) Patent No.: US 11,636,703 B2
(45) Date of Patent: Apr. 25, 2023

(54) DISPLAY APPARATUS AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Xiaoyan Yang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 145 days.

(21) Appl. No.: 16/966,810

(22) PCT Filed: Dec. 25, 2019

(86) PCT No.: PCT/CN2019/128437
§ 371 (c)(1),
(2) Date: Jul. 31, 2020

(87) PCT Pub. No.: WO2020/164316
PCT Pub. Date: Aug. 20, 2020

(65) Prior Publication Data
US 2021/0216740 A1 Jul. 15, 2021

(30) Foreign Application Priority Data
Feb. 15, 2019 (CN) .......................... 201910122673.7

(51) Int. Cl.
*H01L 27/32* (2006.01)
*G06V 40/13* (2022.01)
(Continued)

(52) U.S. Cl.
CPC ....... *G06V 40/1318* (2022.01); *G09G 3/3233* (2013.01); *H10K 59/126* (2023.02);
(Continued)

(58) Field of Classification Search
CPC ............ G06V 40/1318; G06V 40/1359; H01L 27/3234; H01L 27/3262; H01L 27/3272;
(Continued)

(56) References Cited

U.S. PATENT DOCUMENTS

2018/0033835 A1* 2/2018 Zeng ................... G06V 40/1318
2018/0068157 A1* 3/2018 Zeng ................... G06V 40/1359
(Continued)

FOREIGN PATENT DOCUMENTS

CN 206058223 U 3/2017
CN 106886767 A 6/2017
(Continued)

OTHER PUBLICATIONS

First Office Action dated Jul. 20, 2020 in Chinese Application No. 201910122673.7.

*Primary Examiner* — Abdul-Samad A Adediran
(74) *Attorney, Agent, or Firm* — McDermott Will & Emery LLP

(57) ABSTRACT

A display apparatus has a display region, and the display region includes a texture recognition region. The display apparatus includes: a display panel, a light-shielding layer disposed on a side of the display panel opposite to a light-exit side of the display panel, and a texture recognition structure disposed on a side of the light-shielding layer facing away from the display panel. The light-shielding layer includes a plurality of first through holes. The texture recognition structure is located in the texture recognition region. The texture recognition structure includes a plurality (Continued)

of texture recognition devices arranged in one-to-one correspondence with the plurality of first through holes.

12 Claims, 6 Drawing Sheets

(51) Int. Cl.
    *G09G 3/3233*     (2016.01)
    *H01L 27/12*     (2006.01)
    *H01L 27/146*     (2006.01)
    *H01L 29/786*     (2006.01)

(52) U.S. Cl.
    CPC ......... *H10K 59/1213* (2023.02); *H10K 59/65* (2023.02); *H10K 71/00* (2023.02); *H10K 77/111* (2023.02); *H01L 27/1222* (2013.01); *H01L 27/14678* (2013.01); *H01L 29/78675* (2013.01); *H10K 59/1201* (2023.02); *H10K 2102/311* (2023.02)

(58) Field of Classification Search
    CPC . H01L 51/0097; H01L 51/56; H01L 27/1222; H01L 27/14678; H01L 29/78675; H01L 2227/323; H01L 2251/5338; H01L 27/1225; G02B 6/0088; H05B 33/12; G02F 1/1335; G06F 3/0412

See application file for complete search history.

(56) References Cited

U.S. PATENT DOCUMENTS

| | | | |
|---|---|---|---|
| 2018/0089491 A1* | 3/2018 | Kim | G02B 6/0088 |
| 2018/0314873 A1 | 11/2018 | Yang et al. | |
| 2019/0019813 A1* | 1/2019 | Ren | H01L 27/1225 |
| 2019/0050621 A1 | 2/2019 | Xu et al. | |
| 2019/0251326 A1 | 8/2019 | Sun | |
| 2019/0303638 A1* | 10/2019 | Zeng | G06F 3/0412 |
| 2020/0201098 A1* | 6/2020 | Gu | G02F 1/1335 |
| 2021/0327979 A1* | 10/2021 | Kamada | H05B 33/12 |

FOREIGN PATENT DOCUMENTS

| | | |
|---|---|---|
| CN | 107102693 A | 8/2017 |
| CN | 107330426 A | 11/2017 |
| CN | 107368822 A | 11/2017 |
| CN | 107871447 A | 4/2018 |
| CN | 109271829 A | 1/2019 |
| CN | 109887964 A | 6/2019 |

* cited by examiner

DISPLAY APPARATUS AND MANUFACTURING METHOD THEREOF

CROSS-REFERENCE TO RELATED APPLICATIONS

This application is a national phase entry under 35 USC 371 of International Patent Application No. PCT/CN2019/128437 filed on Dec. 25, 2019, which claims priority to Chinese Patent Application No. 201910122673.7, filed on Feb. 15, 2019, which are incorporated herein by reference in their entirety.

TECHNICAL FIELD

The present disclosure relates to the field of display technologies, and in particular, to a display apparatus and a manufacturing method thereof.

BACKGROUND

As the development of organic light-emitting diodes (OLEDs) becomes faster and faster, more and more functions are developed. As the development direction of OLED display panels gradually shifts from wide bezels to narrow bezels or even full screens, fingerprint recognition technology has gradually developed toward under-screen fingerprint recognition.

SUMMARY

In an aspect, a display apparatus is provided. The display apparatus has a display region, and the display region includes a texture recognition region. The display apparatus includes: a display panel; a light-shielding layer disposed on a side of the display panel opposite to a light-exit side of the display panel; and a texture recognition structure disposed on a side of the light-shielding layer facing away from the display panel. The light-shielding layer includes a plurality of first through holes. The texture recognition structure is located in the texture recognition region. The texture recognition structure includes a plurality of texture recognition devices arranged in one-to-one correspondence with the plurality of first through holes.

In some embodiments, the display apparatus further includes a protective layer disposed on the side of the light-shielding layer facing away from the display panel.

In some embodiments, the texture recognition structure is disposed on a side of the protective layer facing away from the light-shielding layer.

In some embodiments, the display apparatus further includes a transparent adhesive layer disposed between the display panel and the light-shielding layer.

In some embodiments, a size of the texture recognition region is less than a size of the display region. The light-shielding layer further includes a plurality of second through holes located in a region of the display region other than the texture recognition region.

In some embodiments, the plurality of first through holes and the plurality of second through holes are arranged in an array.

In some embodiments, a size of the texture recognition region is equal to a size of the display region.

In some embodiments, the display panel includes an array substrate. The array substrate includes a substrate and a thin film transistor disposed above the substrate. The thin film transistor includes an active layer, and a material of the active layer includes crystal silicon.

In some embodiments, the thin film transistor is a top-gate thin film transistor.

In some embodiments, a material of the light-shielding layer includes metal or resin.

In some embodiments, the resin is carbon-containing resin.

In some embodiments, the plurality of texture recognition devices and the plurality of first through holes are both arranged in an array.

In some embodiments, the display panel is a flexible display panel.

In some embodiments, the display panel is a self-luminous display panel.

In some embodiments, each texture recognition device is configured to collect light reflected by an object to be detected after the light emitted from the display panel being irradiated onto the object to be detected, so as to recognize a texture of the object.

In some embodiments, the texture recognition device includes a photoelectric sensor.

In another aspect, a manufacturing method of a display apparatus is provided. The method includes: manufacturing a display panel; arranging a light-shielding layer on a side of the display panel opposite to a light-exit side of the display panel, the light-shielding layer including a plurality of first through holes; and arranging a texture recognition structure on a side of the light-shielding layer facing away from the display panel, the texture recognition structure being located in a texture recognition region of the display apparatus, the texture recognition structure including a plurality of texture recognition devices arranged in one-to-one correspondence with the plurality of first through holes.

In some embodiments, arranging a light-shielding layer on a side of the display panel opposite to a light-exit side of the display panel, includes: providing a protective layer, and manufacturing the light-shielding layer on a side of the protective layer by using a patterning process; applying a transparent adhesive layer on a side of the light-shielding layer facing away from the protective layer; and bonding a side of the transparent adhesive layer facing away from the light-shielding layer to the side of the display panel opposite to the light-exit side of the display panel.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual dimensions of products or actual processes of methods that the embodiments of the present disclosure relate to.

DETAILED DESCRIPTION

The technical solutions in some embodiments of the present disclosure will be described clearly and completely with reference to the accompanying drawings. Obviously, the described embodiments are merely some but not all of embodiments of the present disclosure. All other embodiments obtained on a basis of the embodiments of the present disclosure by a person of ordinary skill in the art shall be included in the protection scope of the present disclosure.

Unless the context requires otherwise, term "comprise" and other forms thereof such as the third-person singular form "comprises" and the present participle form "comprising" in the Description and the claims are construed as an open and inclusive, meaning "inclusive; but not limited to". In the Description, terms such as "one embodiment", "some embodiments", "exemplary embodiments", "example", "some examples", or "specific example" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition; the specific features; structures, materials or characteristics may be included in any one or more embodiments or examples in any suitable manner.

Below, the terms such as "first" and "second" are used for descriptive purposes only, and are not to be construed as indicating or implying the relative importance or implicitly indicating the number of indicated technical features. Thus, features defined as "first", "second" may explicitly or implicitly include one or more of the features. In the description of the embodiments of the present disclosure, term "a/the plurality of" means two or more unless otherwise specified.

In addition, "at least one of A, B, and C" has the same meaning as "at least one of A, B, or C", and both include the following combinations of A, B, and C: only A, only B, only C, combination of A and B, combination of A and C, combination of B and C, and combination of A, B and C.

Figure 1A:
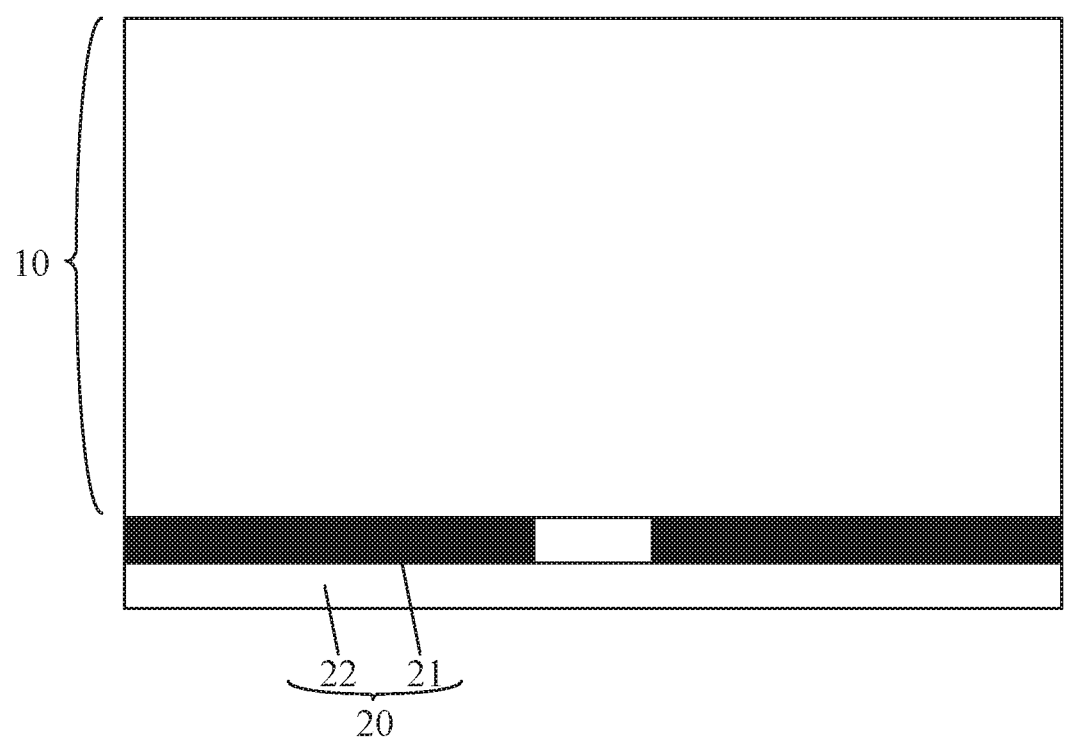
FIG. 1A is a structural diagram of a display apparatus, according to some embodiments of the present disclosure.
Figure 2:
FIG. 2 is a diagram showing a positional relationship between first through holes and texture recognition devices, according to some embodiments of the present disclosure.

Some embodiments of the present disclosure provide a display apparatus. The display apparatus has a display region, and the display region includes a texture recognition region. As shown in FIG. 1A, the display apparatus includes a display panel 10, a light-shielding layer 21 disposed on a side of the display panel 10 opposite to a light-exit side of the display panel 10, and a texture recognition structure 22 disposed on a side of the light-shielding layer 21 away from the display panel 10. The texture recognition structure 22 is located in the texture recognition region of the display apparatus, and the texture recognition region is in the display region of the display apparatus. As shown in FIG. 2, the light-shielding layer 21 includes a plurality of first through holes 211, and the texture recognition structure 22 includes a plurality of texture recognition devices 221. The plurality of first through holes 211 and the plurality of texture recognition devices 221 are arranged directly opposite to each other in one-to-one correspondence.

In some examples, a principle of optical texture recognition is as described below. Light reflected by an object to be detected (e.g., a finger) passes through the first through holes 211 and is imaged on the texture recognition devices 221. Since light reflected by valleys and ridges of the finger have different intensities, light that reaches the texture recognition devices 221 after being reflected by the valleys and ridges of the finger also have different intensities. The texture recognition devices 221 convert light of different intensities into electrical signals of different intensities, and a texture recognition circuit performs fingerprint recognition based on the electrical signals.

Herein, in a case where optical fingerprint recognition technology is used for fingerprint recognition, in order to improve an accuracy of fingerprint recognition, the principle of pinhole imaging may be adopted, and a light-shielding layer having light-transmitting holes may be disposed above an optical sensor.

It will be noted that, the display apparatus may not only be used for fingerprint recognition, but also be used for texture recognition of other objects to be detected that have textures. For example, the other object to be detected may be a palm of a hand, so as to use the display apparatus to perform texture recognition on a palm print. For convenience of description, some embodiments of the present disclosure are described with the object to be detected being a finger and fingerprint recognition as an example.

In some embodiments, a specific structure of the texture recognition structure 22 is not limited, as long as the texture recognition structure 22 can convert optical signals into the electrical signals. For example, each texture recognition device 221 includes at least one of a photosensitive sensor, a photoelectric sensor, or the like.

In some embodiments, an arrangement of the plurality of texture recognition devices 221 in the texture recognition structure 22 is not limited, as long as the arrangement thereof meets the requirement that fingerprint detection may be performed when a finger touches any position in the texture recognition region of the display apparatus.

For example, two adjacent texture recognition devices 221 may be arranged adjoining each other (that is, there is no space between the two adjacent texture recognition devices); or, as shown in FIG. 2, two adjacent texture recognition devices 221 may be arranged at intervals (that is, there is a space between the two adjacent texture recognition devices).

For example, every two adjacent texture recognition devices 221 in the texture recognition structure 22 are arranged adjoining each other. For another example, every two adjacent texture recognition devices 221 in the texture recognition structure 22 are arranged at intervals. For yet another example, two adjacent texture recognition devices 221 in the texture recognition structure 22 may be arranged adjoining each other, and another two adjacent texture recognition devices 221 in the texture recognition structure 22 may be arranged at intervals.

In some embodiments, the texture recognition devices 221 are arranged in an array; or, the texture recognition devices 221 are arranged irregularly. Some embodiments of the present disclosure do not limit this, as long as the texture recognition devices can perform texture recognition.

In some embodiments, shapes of orthographic projections of the first through holes 211 on the display panel are not limited, as long as light passing through one first through hole 211 can finally reach one optical sensor unit 221 that is directly opposite to the first through hole 211.

Figure 3A:
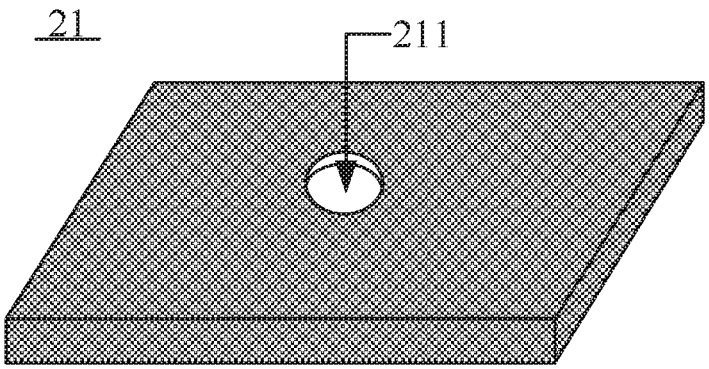
FIG. 3A is a structural diagram of a first through hole, according to some embodiments of the present disclosure.
Figure 3B:
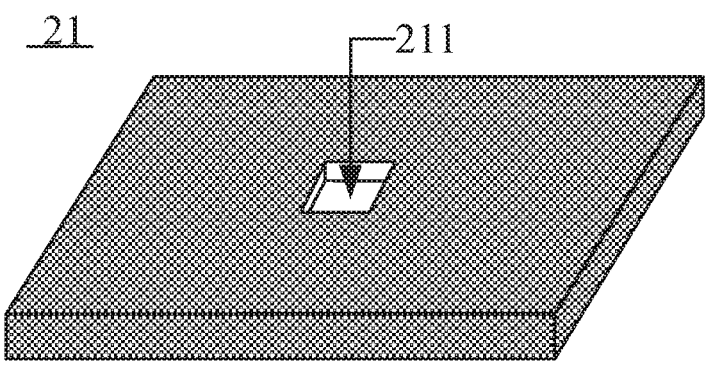
FIG. 3B is a structural diagram of another first through hole, according to some embodiments of the present disclosure.
Figure 3C:
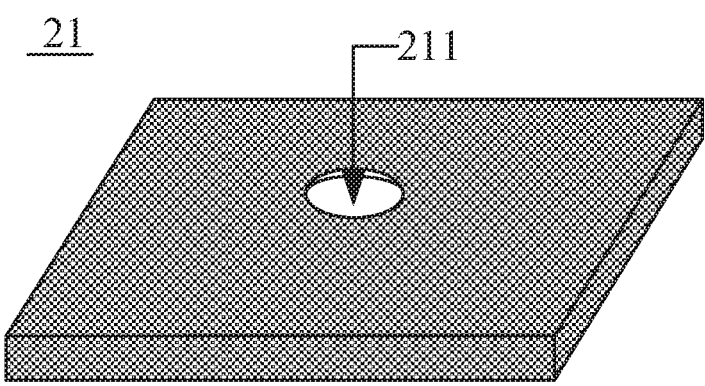
FIG. 3C is a structural diagram of yet another first through hole, according to some embodiments of the present disclosure.

For example, a shape of an orthographic projection of each first through hole 211 on the display panel is a circle (as shown in FIG. 3A), a rectangle (as shown in FIG. 3B), or an ellipse (as shown in FIG. 3C).

In some embodiments, a size of the first through hole 211 is not limited. Specifically, the size of the first through hole 211 is related to a thickness of the display panel, a distance between the light-shielding layer 21 and the texture recognition structure 22, a size of each texture recognition device 221, and the shape of the first through hole 211.

For example, a shape of the texture recognition device 221 is a circle, and a diameter of the texture recognition device 221 is within a range from 1 μm to 7 μm, inclusive. For example, the diameter of the texture recognition device 221 is 1 μm, 6 μm, or 7 μm.

In some embodiments, the plurality of first through holes 211 and the plurality of texture recognition devices 221 are arranged directly opposite to each other in one-to-one correspondence. For example, one first through hole 211 corresponds to one texture recognition device 221, and a center of the first through hole 211 and a center of the texture recognition device 221 corresponding to this first through hole 211 are on a same vertical line.

In some embodiments, a material of the light-shielding layer 21 is not limited, as long as the light-shielding layer 21 can shield light.

For example, the material of the light-shielding layer 21 may be metal. For another example, the material of the light-shielding layer 21 may be resin (e.g., carbon-containing resin).

Figure 4:
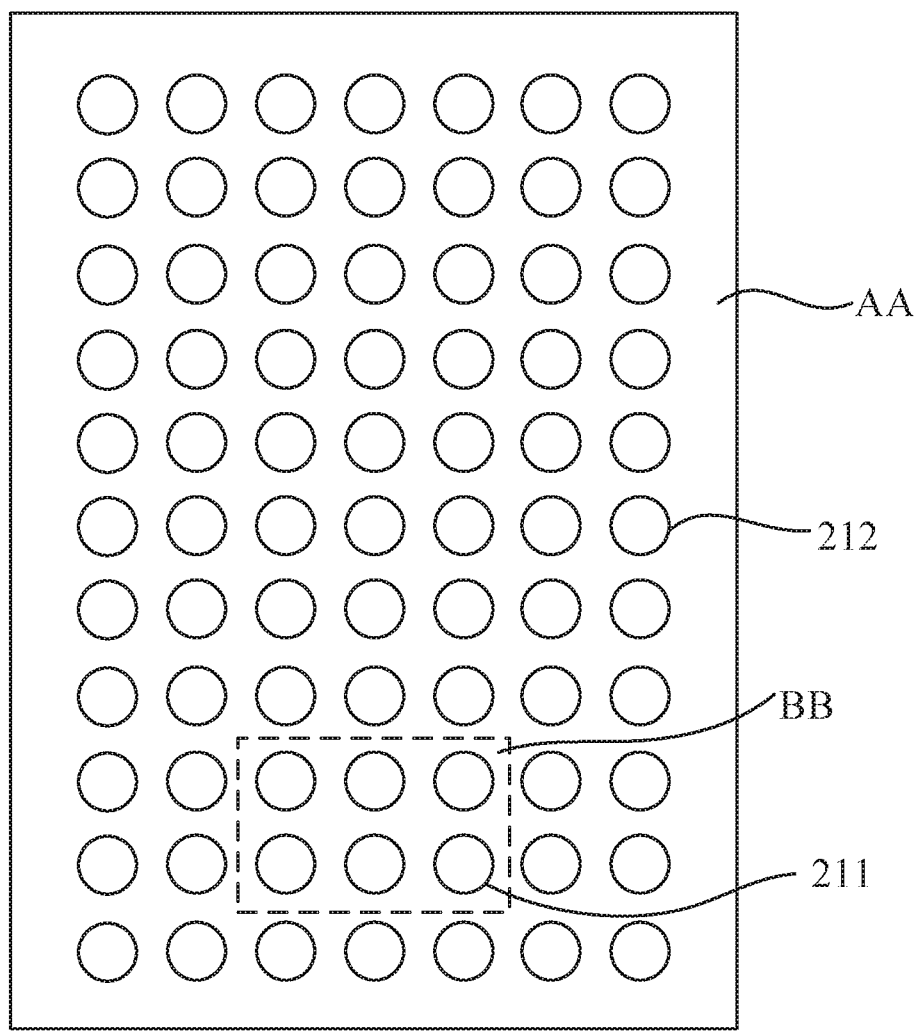
FIG. 4 is a top view of a light-shielding layer, according to some embodiments of the present disclosure.
Figure 5:
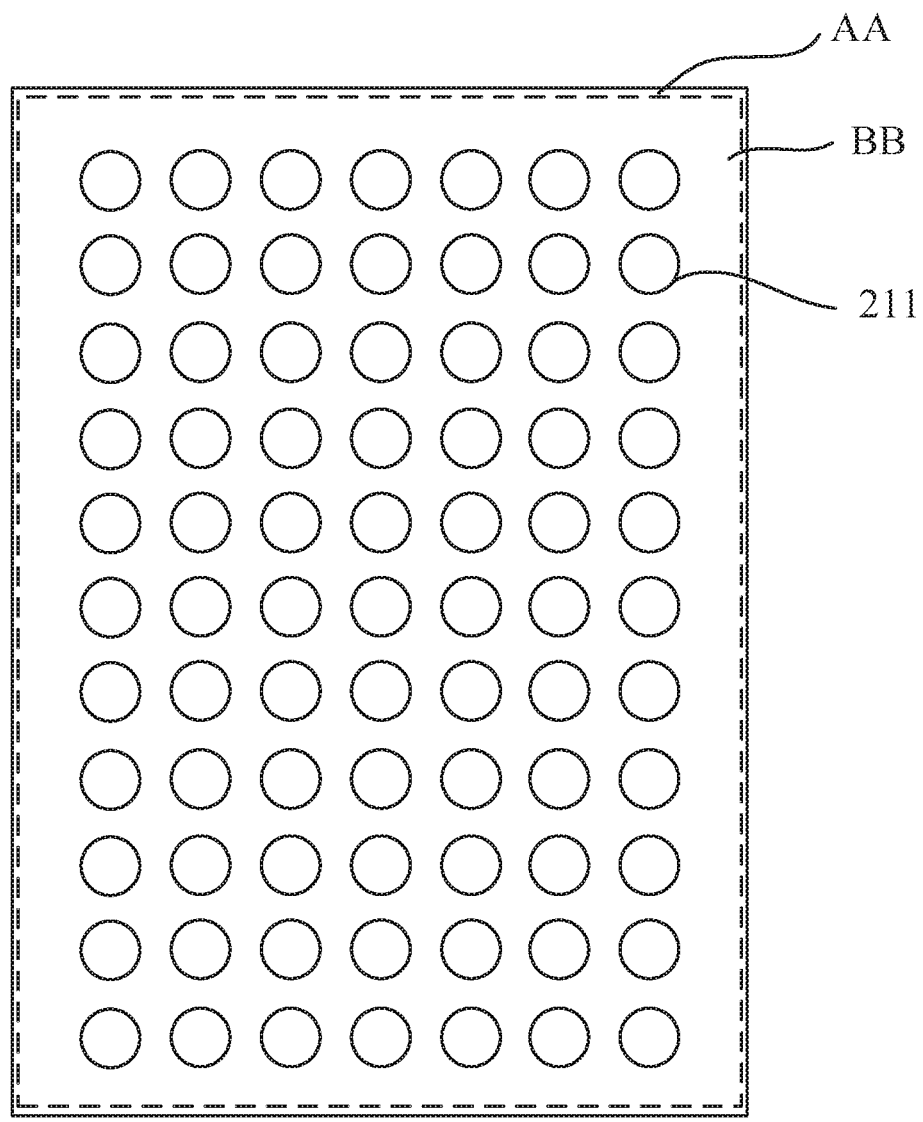
FIG. 5 is a top view of another light-shielding layer, according to some embodiments of the present disclosure.

In some embodiments, as shown in FIGS. 4 and 5, a size of the texture recognition region BB is equal to a size of the display region AA; or, the size of the texture recognition region BB is less than the size of the display region AA.

For example, in a case where the size of the texture recognition region BB is equal to the size of the display region AA, the fingerprint recognition may be performed in the entire display region AA of the display device.

In some embodiments, considering that the light-shielding layer 21 is disposed on the side of the display panel opposite to the light-exit side of the display panel, in order to prevent the light-shielding layer 21 from affecting normal display of the display apparatus, the display panel may be a self-luminous display panel.

Figure 1B:
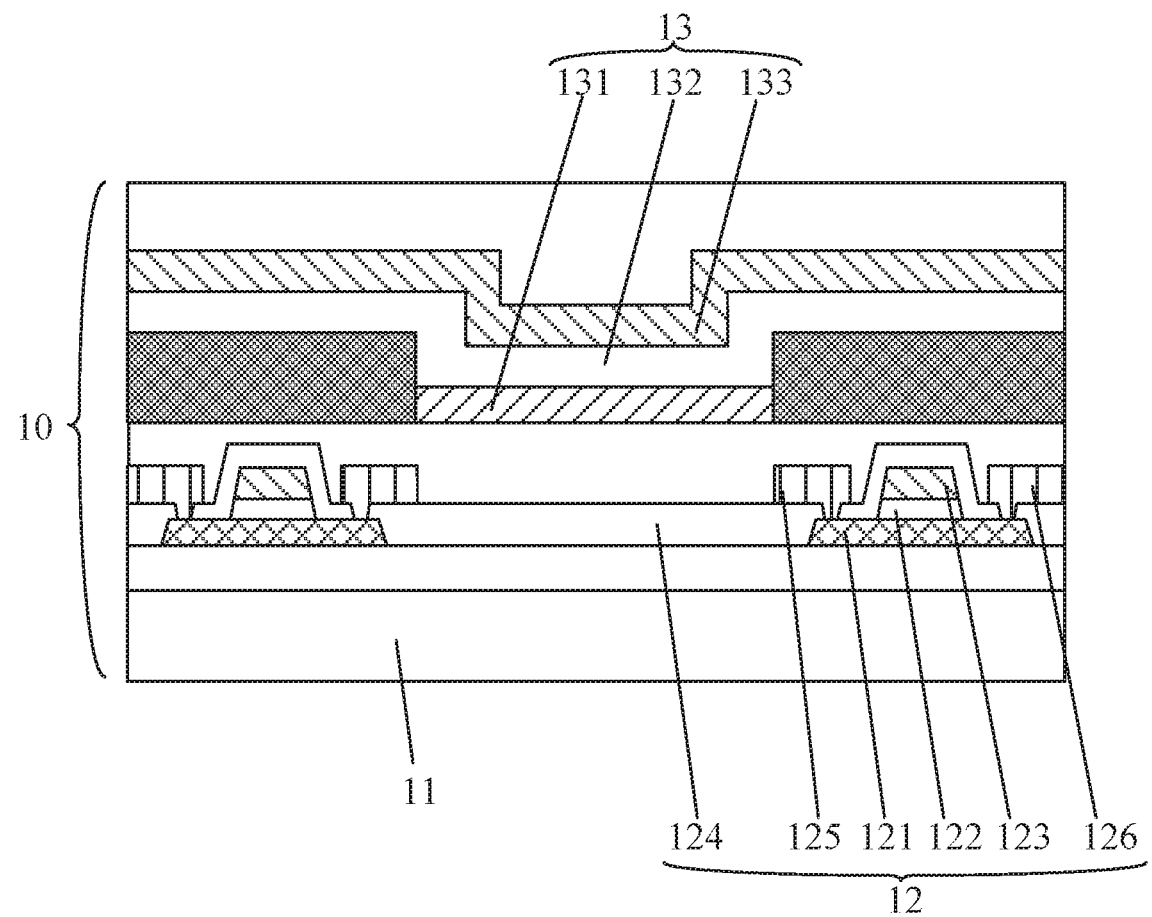
FIG. 1B is a structural diagram of a display panel, according to some embodiments of the present disclosure.

For example, the display panel may be an organic light-emitting diode (OLED) display panel. As shown in FIG. 1B, the OLED display panel includes an OLED device 13. The OLED device 13 includes a first electrode 131, a light-emitting functional layer 132, and a second electrode 133. In a case where the first electrode 131 is an anode, the second electrode 133 is a cathode; and in a case where the first electrode 131 is a cathode, the second electrode 133 is an anode.

In addition; the self-luminous display panel may be of a top-emitting type or a bottom-emitting type. The light-shielding layer 21 and the texture recognition structure 22 are disposed on a non-display side of the self-luminous display panel, which is opposite to a display side of the self-luminous display panel.

In summary, some embodiments of the present disclosure provide a display apparatus, and the light-shielding layer 21 and the texture recognition structure 22 are disposed outside the display panel. In this way, on one hand, a process of manufacturing the display panel may be simplified; on another hand, manufacturing the display panel and manufacturing the light-shielding layer 21 and the texture recognition structure 22 may be performed in different manufacturing processes. That is, during a manufacturing process of the display panel, the light-shielding layer 21 and the texture recognition structure 22 may be manufactured simultaneously. Finally, the light-shielding layer 21 and the texture recognition structure 22 that are manufactured as a one-piece structure are attached to the display panel, so as to save a manufacturing time of the display apparatus and reduce impurities adhering to the display apparatus.

In some embodiments; as shown in FIG. 1B, the display panel includes an array substrate. The array substrate includes a substrate 11 and thin film transistors 12 disposed above the substrate 11, Each thin film transistor 12 includes an active layer 121, and a material of the active layer 121 includes crystal silicon. In addition, the thin film transistor 12 further includes a gate insulating layer 122, a gate 123, a source 125, and a drain 126.

In some embodiments, the array substrate further includes a buffer layer disposed between the substrate 11 and the thin film transistors 12.

It will be noted that each thin film transistor 12 may be any one of a top gate type, a bottom gate type, or a double gate type.

In some embodiments, in a case where the thin film transistor 12 is a top-gate thin film transistor, the thin film transistor 12 further includes an interlayer insulating layer 124 disposed between the gate 123 and both the source 125 and the drain 126.

In some examples, the material of the active layer 121 includes silicon. For example, the material of the active layer 121 is at least one of amorphous silicon (a-Si), polysilicon (p-Si), or low temperature polysilicon (LTPS).

In the related art, a light-shielding layer is usually disposed between a substrate and a buffer layer. Since a light-shielding layer includes a plurality of light-transmitting holes, a surface of the buffer layer away from the substrate is uneven (for example, there are depressions and protrusions on the surface of the buffer layer away from the substrate). After arranging a thin film transistor on a side of the buffer layer away from the substrate, if an active layer of the thin film transistor includes crystal silicon, in a crystallization process of the crystal silicon, a difference in crystallization may occur due to the uneven surface of the buffer layer away from the substrate.

Specifically, there is a difference in crystallization between a portion of the crystal silicon on the depressions of the surface of the buffer layer away from the substrate and a portion of the crystal silicon on the protrusions of the surface of the buffer layer away from the substrate. As a result, it reduces a uniformity of the active layer and affects properties of the thin film transistor, and thereby affects a display effect of the display apparatus.

On this basis, in the display apparatus provided by some embodiments of the present disclosure, the light-shielding layer 21 is disposed outside the display panel, and the display panel and the light-shielding layer 21 are manufactured separately. In this way, each structure in the display panel will not be affected by the light-shielding layer 21 during a formation process thereof. In this way, the crystal silicon in the active layer 121 will not have the difference in crystallization due to existence of the light-shielding layer 21. Therefore, it may be possible prevent a poor uniformity of the active layer 121 from affecting the properties of the thin film transistor 12 and affecting the display effect of the display apparatus.

In some embodiments, an active layer 121 of the top-gate thin film transistor is closer to the buffer layer than an active layer 121 of the bottom-gate thin film transistor or the double-gate thin film transistor. If the active layer 121 of the top-gate thin film transistor is disposed on the buffer layer, the uniformity of the active layer 121 of the top-gate thin film transistor will be worse. Therefore, some embodiments of the present disclosure may be able to effectively solve the problem of poor uniformity of the active layer 121 of the top-gate thin film transistor.

In some embodiments, the material of the light-shielding layer 21 includes metal.

In some embodiments, if metal is used as the material of the light-shielding layer 21, the light-shielding layer 21 may have a small thickness, and therefore the thickness of the display apparatus may be reduced.

However, if the arrangement in the related art is adopted (that is, the light-shielding layer is disposed between the substrate and the buffer layer) and the material of the light-shielding layer includes metal, the light-shielding layer will interact with conductive structures (e.g., a gate) in the thin film transistor due to the electrical conductivity of the light-shielding layer, resulting in accumulation of charges. This will cause overall performance drift of the thin film transistor and thereby affect the display effect of the display device.

In some embodiments of the present disclosure, even if the material of the light-shielding layer 21 includes metal, compared with the related art, a distance between the light-shielding layer 21 and the conductive structures in the thin film transistor 12 is longer. Therefore, it may be possible to prevent the light-shielding layer 21 from interacting with the conductive structures in the thin film transistor 12 to a certain extent, and to avoid the overall performance drift of the thin film transistor 12 due to the accumulation of charges, thereby improving the display effect of the display apparatus.

In some embodiments, as shown in FIG. 4, in the case where the size of the texture recognition region BB is less than the size of the display region AA, the light-shielding layer 21 further includes a plurality of second through holes 212. The second through holes 212 are located in a region of the display region AA other than the texture recognition region BB. It will be noted that some embodiments of the present disclosure do not limit a position of the texture recognition region BB in the display region AA.

For example, a shape and size of the second through holes 212 may be the same as the shape and size of the first through holes 211; or, the shape and size of the second through holes 212 may be different from the shape and size of the first through holes 211, which is not limited in some embodiments of the present disclosure.

In some embodiments, as shown in FIG. 4, in the case where the size of the texture recognition region BB is less than the size of the display region AA, the light-shielding layer 21 further includes the plurality of second through holes 212 located in the region of the display region AA other than the texture recognition region BB. When the display device is put into use, heat may be through the first through holes 211 and the second through holes 212.

In some embodiments, as shown in FIG. 4, the second through holes 212 and the first through holes 211 are arranged in an array, and the shape and size of the second through holes 212 are the same as the shape and size of the first through holes 211. In this way, the heat of the display apparatus can be dissipated evenly.

In some embodiments, as shown in FIG. 5, in the case where the size of the texture recognition region BB is equal to the size of the display region AA, the first through holes 211 are in one-to-one correspondence with the texture recognition devices 221, and there is no need to provide the second through holes 212. In this case, the heat of the entire display apparatus may be dissipated by using the first through holes 211. It will be noted that, the size of the texture recognition region BB is shown to be slightly less than the size of the display region AA in FIG. 5 for clarity of illustration. However, in fact, the sizes of the two are the same.

It will be noted that, the size of the texture recognition region BB may be equal to the size of the display region AA; or, the size of the texture recognition region BB may be less than the size of the display region AA, which is not limited in some embodiments of the present disclosure.

In some embodiments, the display panel is a flexible display panel.

Figure 6:
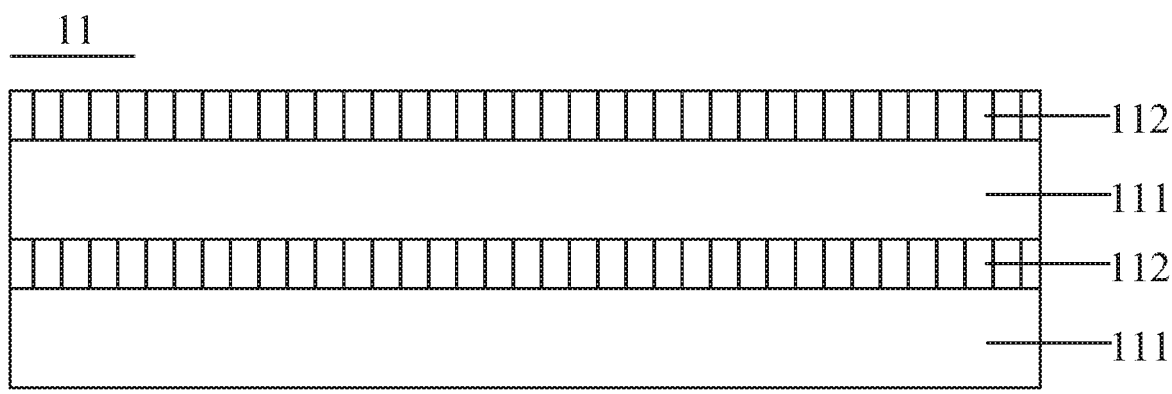
FIG. 6 is a structural diagram of a substrate, according to some embodiments of the present disclosure.

As shown in FIG. 6, the substrate 11 of the flexible display panel may be composed of flexible films 111 and spacer layers 112 that are arranged alternately.

For example, a material of the flexible film 111 may be polyimide (PI).

In some embodiments, the flexible display panel is usually manufactured on a rigid substrate, Therefore, the longer the manufacturing time of the flexible display panel, the more impurities scattered in the display panel and attached from the rigid substrate. In some embodiments of the present disclosure, the light-shielding layer 21 is disposed outside the flexible display panel, so that the light-shielding layer 21 and the flexible display panel are independent of each other. In this way, it may be possible to reduce the manufacturing time of the flexible display panel and thereby reduce the impurities adhering to the display panel.

Figure 7:
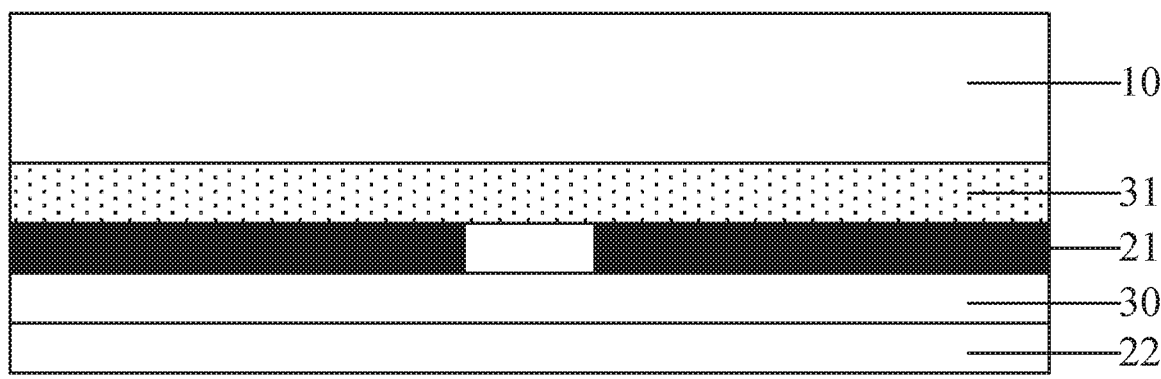
FIG. 7 is a structural diagram of a display apparatus, according to some embodiments of the present disclosure.

In some embodiments, as shown in FIG. 7, the display apparatus further includes a protective layer 30. The protective layer 30 is disposed on the side of the light-shielding layer 21 away from the display panel 10.

In some embodiments, as shown in FIG. 7, the display apparatus further includes a transparent adhesive layer 31. The transparent adhesive layer 31 is disposed between the display panel and the light-shielding layer. The transparent adhesive layer 31 is configured to fix the light-shielding layer 21 and the protective layer 30 on the display panel 10. A material of the transparent adhesive layer 31 may be pressure sensitive adhesive (PSA); or, the material of the transparent adhesive layer 31 may be optically clear adhesive (OCA).

It will be noted that, some embodiments of the present disclosure do not limit the material of the protective layer 30, as long as the protective layer 30 may protect the flexible display panel in a case where the display panel 10 is the flexible display panel.

For example, the material of the protective layer 30 is poly terephthalic acid plastics (e.g., polyethylene terephthalate (PET)).

In some embodiments, the protective layer 30 may protect both the light-shielding layer 21 and the flexible display panel.

Some embodiments of the present disclosure further provide a method manufacturing of a display apparatus. As shown in FIGS. 1A, 2 and 7, the manufacturing method includes: manufacturing a display panel; arranging a light-shielding layer 21 on a side of the display panel 10 opposite to a light-exit side of the display panel 10, the light-shielding layer 21 including a plurality of first through holes 211; and arranging a texture recognition structure 22 on a side of the light-shielding layer away from the display panel. The texture recognition structure 22 is located in a texture recognition region of the display apparatus, the texture recognition structure includes a plurality of texture recognition devices 221, and the plurality of texture recognition devices 221 are arranged in one-to-one correspondence with the plurality of first through holes 211.

In some embodiments, in the manufacturing method of the display apparatus, arranging a light-shielding layer 21 on a side of the display panel 10 opposite to a light-exit side of the display panel 10 includes: providing a protective layer 30, and manufacturing the light-shielding layer 21 on a side of the protective layer 30 by using a patterning process; applying a transparent adhesive layer 31 on a side of the light-shielding layer 21 away from the protective layer 30; and attaching the protective layer 30 with the light-shielding layer 21 and the transparent adhesive layer 31 to the side of the display panel 10 opposite to the light-exit side of the display panel 10.

The transparent adhesive layer 31 is configured to fix the light-shielding layer 21 and the protective layer 30 on the display panel 10. A material of the transparent adhesive layer 31 may be pressure sensitive adhesive (PSA); or, the material of the transparent adhesive layer 31 may be optically clear adhesive (OCA).

In some embodiments, a specific structure of the texture recognition structure 22 is not limited, as long as the texture recognition structure 22 can convert optical signals into electrical signals. For example, each texture recognition device 221 includes at least one of a photosensitive sensor, a photoelectric sensor, or the like.

In some embodiments, an arrangement of the plurality of texture recognition devices 221 in the texture recognition structure 22 is not limited, as long as the arrangement thereof meets the requirement that fingerprint detection may be performed when a finger touches any position of the texture recognition region of the display apparatus.

For example, two adjacent texture recognition devices 221 may be arranged adjoining each other (that is, there is no space between the two adjacent texture recognition devices); or, as shown in FIG. 2, two adjacent texture recognition devices 221 may be arranged at intervals (that is, there is a space between the two adjacent texture recognition devices).

For example, every two adjacent texture recognition devices 221 in the texture recognition structure 22 are arranged adjoining each other. For another example, every two adjacent texture recognition devices 221 in the texture recognition structure 22 are arranged at intervals. For yet another example, two adjacent texture recognition devices 221 in the texture recognition structure 22 may be arranged adjoining each other, and another two adjacent texture recognition devices 221 in the texture recognition structure 22 may be arranged at intervals.

In some embodiments, the texture recognition devices 221 are arranged in an array; or, the texture recognition devices 221 are arranged irregularly. Some embodiments of the present disclosure do not limit this, as long as the texture recognition devices can perform texture recognition.

In some embodiments, a shape of an orthographic projection of each first through hole 211 on the display panel is not limited, as long as light passing through one first through hole 211 can finally reach one optical sensor unit 221 that is directly opposite to the first through hole 211.

For example, the shape of the orthographic projection of the first through hole 211 on the display panel is a circle (as shown in FIG. 3A), a rectangle (as shown in FIG. 3B), or an ellipse (as shown in FIG. 3C).

In some embodiments, a size of the first through hole 211 is not limited. Specifically, the size of the first through hole 211 is related to a thickness of the display panel, a distance between the light-shielding layer 21 and the texture recognition structure 22, a size of each texture recognition device 221, and a shape of the first through hole 211.

For example, a shape of the texture recognition device 221 is a circle, and a diameter of the texture recognition device 221 is within a range from 1 μm to 7 μm, inclusive. For example, the diameter of the texture recognition device 221 is 1 μm, 6 μm, or 7 μm.

In some embodiments, the plurality of first through holes 211 and the plurality of texture recognition devices 221 are arranged directly opposite to each other in one-to-one correspondence. For example, one first through hole 211 corresponds to one texture recognition device 221, and a center of the first through hole 211 and a center of the texture recognition device 221 corresponding to this first through hole 211 are on a same vertical line.

In some embodiments, a material of the light-shielding layer 21 is not limited, as long as the light-shielding layer 21 can shield light.

For example, the material of the light-shielding layer 21 is metal. For another example, the material of the light-shielding layer 21 is resin (e.g., carbon-containing resin).

In some embodiments, as shown in FIGS. 4 and 5, a size of the texture recognition region BB is equal to a size of the display region AA; or, the size of the texture recognition region BB is less than the size of the display region AA.

For example, in a case where the size of the texture recognition region BB is equal to the size of the display region AA, the fingerprint recognition may be performed in the entire display region AA of the display device.

In some embodiments, considering that the light-shielding layer 21 is disposed on the side of the display panel opposite to the light-exit side of the display panel, in order to prevent the light-shielding layer 21 from affecting normal display of the display apparatus, the display panel may be a self-luminous display panel.

For example, the display panel is an organic light-emitting diode (OLED) display panel. As shown in FIG. 1B, the OLED display panel includes an OLED device 13. The OLED device 13 includes a first electrode 131, a light-emitting functional layer 132, and a second electrode 133. In a case where the first electrode 131 is an anode, the second electrode 133 is a cathode. In a case where the first electrode 131 is a cathode, the second electrode 133 is an anode.

In addition, the self-luminous display panel may be of a top-emitting type or a bottom-emitting type. The light-shielding layer 21 and the texture recognition structure 22 are disposed on a non-display side of the self-luminous display panel; which is opposite to a display side of the self-luminous display panel.

Some embodiments of the present disclosure provide a manufacturing method of a display apparatus, the light-shielding layer 21 and the texture recognition structure 22 are disposed outside the display panel. In this way, on one hand, a process of manufacturing the display panel may be simplified; on another hand, manufacturing the display panel and manufacturing the light-shielding layer 21 and the texture recognition structure 22 may be performed in different manufacturing processes. That is, during a manufacturing process of the display panel, the light-shielding layer 21 and the texture recognition structure 22 may be manufactured simultaneously. Finally, the light-shielding layer 21 and the texture recognition structure 22 that are manufactured as a one-piece structure are attached to the display panel, so as to save a manufacturing time of the display apparatus and reduce impurities adhering to the display apparatus.

In some embodiments, as shown in FIGS. 1A and 7, the display panel 10 is a flexible display panel. The light-shielding layer 21 and the texture recognition structure 22 constitute at least a part of a texture recognition module 20. The display apparatus further includes a protective layer 30 located between the light-shielding layer 21 and the texture recognition structure 22.

It will be noted that, the material of the protective layer 30 is not limited, as long as the protective layer 30 may protect the flexible display panel in the case where the display panel 10 is the flexible display panel.

For example, the material of the protective layer 30 is PET.

In some embodiments, the protective layer 30 may protect both the light-shielding layer 21 and the flexible display panel.

The foregoing descriptions are merely some specific implementation manners of the present disclosure, but the protection scope of the present disclosure is not limited thereto. Any person skilled in the art could conceive of changes of replacements within the technical scope disclosed by the present disclosure, which shall all be included in the protection scope of the present disclosure. Therefore, the protection scope of the present disclosure shall be subject to the protection scope of the claims.

What is claimed is:

1. A display apparatus having a display region, the display region including a texture recognition region, wherein a size of the texture recognition region is less than a size of the display region; the display apparatus comprising:
    a display panel;
    a light-shielding layer disposed on a side of the display panel opposite to a light-exit side of the display panel, the light-shielding layer including a plurality of first through holes located in the texture recognition region and a plurality of second through holes located in a region of the display region other than the texture recognition region, wherein the plurality of first through holes and the plurality of second through holes are arranged in an array, and shapes and sizes of the second through holes are the same as shapes and sizes of the first through holes;
    a texture recognition structure disposed on a side of the light-shielding layer facing away from the display panel, the texture recognition structure being located in the texture recognition region, and the texture recognition structure including a plurality of texture recognition devices arranged in one-to-one correspondence with the plurality of first through holes, wherein a center of the first through hole and a center of the texture recognition device corresponding to this first through hole are on a same vertical line, a shape of the texture recognition device is a circle, and a diameter of the texture recognition device is within a range from 1 µm to 7 µm, inclusive; and
    a protective layer disposed on the side of the light-shielding layer facing away from the display panel, wherein
    the light-shielding layer includes a top surface and a bottom surface, and the protective layer directly contacts the bottom surface of the light-shielding layer,
    the texture recognition structure is disposed on a side of the protective layer facing away from the light-shielding layer, and
    the texture recognition structure is located proximate to a side of the protective layer that is facing away from the light-shielding layer.

2. The display apparatus according to claim 1, further comprising a transparent adhesive layer disposed between the display panel and the light-shielding layer.

3. The display apparatus according to claim 1, wherein the display panel includes an array substrate; the array substrate includes a substrate and a thin film transistor disposed above the substrate; the thin film transistor includes an active layer, and a material of the active layer includes crystal silicon.

4. The display apparatus according to claim 3, wherein the thin film transistor is a top-gate thin film transistor.

5. The display apparatus according to claim 1, wherein a material of the light-shielding layer includes metal or resin.

6. The display apparatus according to claim 5, wherein the resin is carbon-containing resin.

7. The display apparatus according to claim 1, wherein the plurality of texture recognition devices and the plurality of first through holes are both arranged in an array.

8. The display apparatus according to claim 1, wherein the display panel is a flexible display panel.

9. The display apparatus according to claim 1, wherein the display panel is a self-luminous display panel.

10. The display apparatus according to claim 9, wherein each texture recognition device is configured to collect light reflected by an object to be detected after the light emitted from the display panel being irradiated onto the object to be detected, so as to recognize a texture of the object.

11. The display apparatus according to claim 10, wherein the texture recognition device includes a photoelectric sensor.

12. A manufacturing method of a display apparatus, wherein the display apparatus has a display region, the display region includes a texture recognition region, and a size of the texture recognition region is less than a size of the display region; the method comprises:
    manufacturing a display panel;
    arranging a light-shielding layer on a side of the display panel opposite to a light-exit side of the display panel, the light-shielding layer including a plurality of first through holes located in the texture recognition region and a plurality of second through holes located in a region of the display region other than the texture recognition region, wherein the plurality of first through holes and the plurality of second through holes are arranged in an array, and shapes and sizes of the second through holes are the same as shapes and sizes of the first through holes; and
    arranging a texture recognition structure on a side of the light-shielding layer facing away from the display panel, the texture recognition structure being located in the texture recognition region of the display apparatus, the texture recognition structure including a plurality of texture recognition devices arranged in one-to-one correspondence with the plurality of first through holes, wherein a center of the first through hole and a center of the texture recognition device corresponding to this first through hole are on a same vertical line, a shape of the texture recognition device is a circle, and a diameter of the texture recognition device is within a range from 1 μm to 7 μm, inclusive; wherein arranging the light-shielding layer on the side of the display panel opposite to the light-exit side of the display panel, includes:

providing a protective layer, and manufacturing the light-shielding layer on a side of the protective layer by using a patterning process, wherein the light-shielding layer includes a top surface and a bottom surface, and the protective layer directly contacts the bottom surface of the light-shielding layer;

applying a transparent adhesive layer on a side of the light-shielding layer facing away from the protective layer; and bonding a side of the transparent adhesive layer facing away from the light-shielding layer to the side of the display panel opposite to the light-exit side of the display panel;

arranging the texture recognition structure on the side of the light-shielding layer facing away from the display panel includes:

arranging the texture recognition structure on a side of the protective layer facing away from the light-shielding layer, wherein the texture recognition structure is located proximate to a side of the protective layer that is facing away from the light-shielding layer.

* * * * *